United States Patent [19]
Fujita et al.

[11] Patent Number: 5,963,073
[45] Date of Patent: *Oct. 5, 1999

[54] π/2 PHASE SHIFTER

[75] Inventors: Kenji Fujita; Hiroshi Takeuchi, both of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/751,730

[22] Filed: Nov. 18, 1996

[30] Foreign Application Priority Data

Nov. 21, 1995 [JP] Japan .................................. 7-302790

[51] Int. Cl.$^6$ ............................ H03K 3/286; H03K 5/13; H03L 7/00
[52] U.S. Cl. ........................ 327/254; 327/244; 327/238; 327/155
[58] Field of Search ................................. 327/236, 238, 327/243, 244, 254, 255, 105, 107, 115, 117, 233, 239, 245, 246, 247, 258, 155, 156

[56] References Cited

U.S. PATENT DOCUMENTS

| | | | |
|---|---|---|---|
| 4,730,349 | 3/1988 | Wilhelm et al. | 327/115 |
| 5,179,731 | 1/1993 | Trankle et al. | 327/105 |
| 5,200,650 | 4/1993 | Cowley et al. | 327/115 |
| 5,230,013 | 7/1993 | Hanke et al. | 375/119 |
| 5,359,241 | 10/1994 | Hasegawa et al. | 327/115 |
| 5,446,322 | 8/1995 | Reynolds | 327/44 |
| 5,497,114 | 3/1996 | Shimozono et al. | 327/202 |

FOREIGN PATENT DOCUMENTS

| | | |
|---|---|---|
| 2-87822 | 3/1990 | Japan . |
| 2089412 | 3/1990 | Japan . |
| 30277018 | 12/1991 | Japan . |
| 5-110369 | 4/1993 | Japan . |
| 7046089 | 2/1995 | Japan . |
| 7046279 | 2/1995 | Japan . |

*Primary Examiner*—Timothy P. Callahan
*Assistant Examiner*—Eunja Shin
*Attorney, Agent, or Firm*—Sughrue, Mion, Zinn, Macpeak & Seas, PLLC

[57] ABSTRACT

The invention is directed to the realization of a π/2 phase shifter that provides accurate operation and moreover enables a reduction in current consumption. Such a π/2 phase shifter is constructed from a 1/2-frequency divider employing a T flip-flop and includes: a current source circuit which supplies to the T flip-flop a circuit current that determines the output frequency of the T flip-flop and which varies circuit current value according to control signals; and a frequency comparator that compares the output frequency of the T flip-flop and the local signal input frequency, and, based on the comparison results, varies the control signals in a direction such that the output frequency of the T flip-flop matches the local signal input frequency.

3 Claims, 14 Drawing Sheets

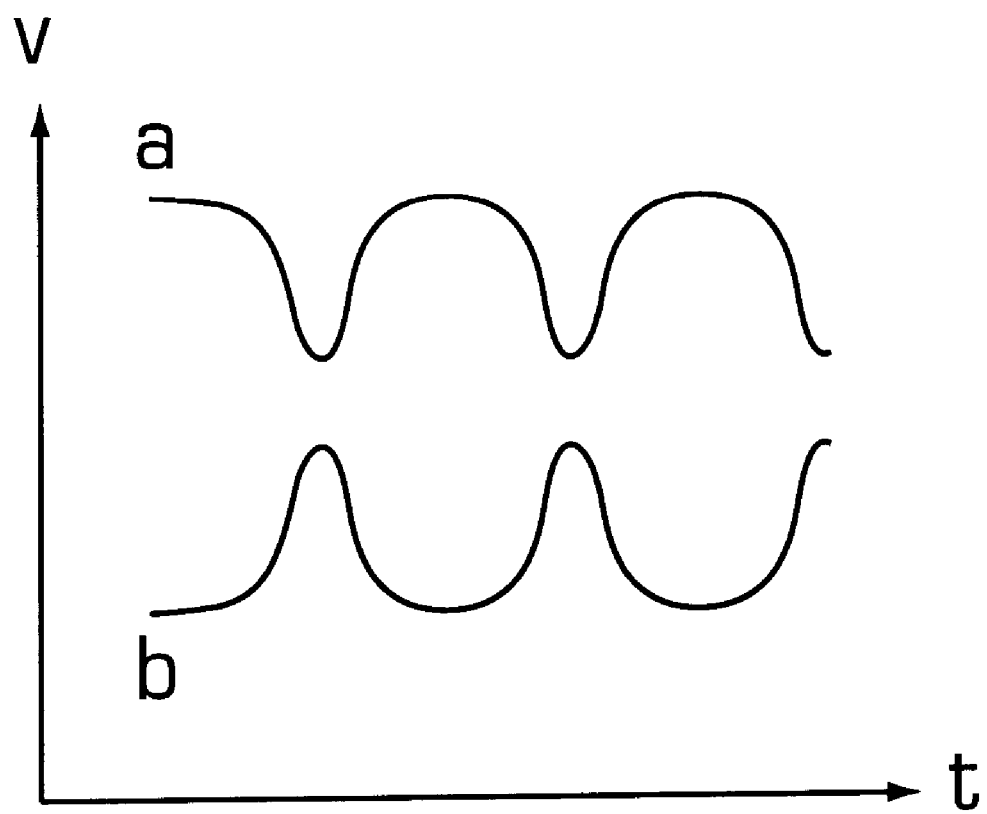

π/2 PHASE SHIFTER

BACKGROUND OF THE INVENTION

1. Field of the Invention

The present invention relates to a π/2 phase shifter, and particularly to a π/2 phase shifter for use in a quaternary modulator-demodulator in digital communications.

2. Description of the Related Art

Modulation methods such as QPSK (quaternary phase shift keying) used in the field of digital communications require high-speed and highly accurate π/2 phase shifters for conferring a precise π/2 phase shift on the carrier signal (local signal).

FIG. 1 shows a π/2 phase shifter of the prior art. This example of the prior art employs a T flip-flop 101 and is constructed such that carrier signal $L_0$ is inputted to T flip-flop 101 by way of frequency multiplier 106.

A phase shifter employing a T flip-flop operates at high speed and with provided with the mutual characteristics of the transistor, readily provides signals having accurate π/2 phase differences of 0°, 90°, 180°, and 270°. Such phase shifters are moreover easy to fabricate within an IC and are therefore widely used in, for example, quaternary modulation-demodulation ICs.

However, the carrier signal ($L_0$) is ½-frequency divided in a phase shifter employing a T flip-flop, and frequency multiplier 106 must therefore be provided in order to double the $L_0$ signal in advance.

FIG. 2 is an output waveform chart of frequency multiplier 106.

A double-balance mixer is generally employed as frequency multiplier 106, the output of a double-balance mixer being represented by the following formula:

$$A\cos f_0 \times B\cos f_0 = (C\cos 2f_0 + D)/2$$

Here, D represents DC offset, and when a large-amplitude signal is inputted as the input signal, or when the gain of frequency multiplier 106 is great, distortion occurs in the output waveform as shown in FIG. 2 due to clipping of the upper limit and lower limit of the dynamic range. When this distorted doubled wave is inputted to T flip-flop 101, any phase error diverging from 90° in the output signal is magnified.

FIG. 3 illustrates a second example of the prior art. This example is provided with CR-RC phase shifter 221 to prevent the occurrence of distortion in the output of frequency multiplier 222. FIG. 3(a) is a block diagram showing the construction of this example, FIG. 3(b) shows the gain characteristics of CR-RC phase shifter 221, and FIG. 3(c) is a waveform chart of the output of frequency multiplier 222.

CR-RC phase shifter 221 is provided in the section preceding frequency multiplier 222. In this case, a combination of the constants of CR and RC results in a phase difference for each of the outputs of 90°, and the output of frequency multiplier 222 is therefore:

$$A\cos f_0 \times B\sin f_0 = (C\cos 2f_0)/2$$

The output waveform is as shown in FIG. 3(c), and therefore, the problem of increased phase error can be basically solved.

However, as shown in FIG. 3(b), each of the outputs of CR-RC circuit 221 describe symmetrical gain-frequency (f) characteristics, and consequently, the operating frequency range of this type of phase shifter is limited to the vicinity of frequencies $f_0$ having equal gain.

FIG. 4 is a block diagram showing the construction of a third example of the prior art in which an APC (automatic phase control) circuit disclosed in Japanese Patent Laid-open No. 87822/90 is employed.

Comparison signal 402 outputted by voltage-controlled oscillator (VCO) 406 passes through phase shifter 405 and is detected at phase detector 404 with respect to reference signal 411 inputted from reference signal input terminal 401. The output voltage 409 of this phase detector 404 is smoothed by low-pass filter 407. The sensitivity of the detection of comparison signal 402 outputted by VCO 406 with respect to reference signal 411 at phase detector 403 is then controlled by detection voltage 409.

The output of the above-described phase detector 403 is smoothed by low-pass filter 408 and supplied to VCO 406, and this detection output 410 is set such that the detection sensitivity decreases when detection output 409 is high (a phase difference of 0° being highest) and increases when detection output 409 is low (a phase difference of 180° being lowest). In other words, an ideal APC control system can be constructed if detection gain is set to a controllable prescribed value at a phase difference of 0° (360°), and detection gain is controlled to a maximum at a phase difference of 180°.

In the π/2 phase shifter of the first example of the above-described prior art, a frequency multiplier is required to obtain gain of a frequency band of up to twice the frequency $L_0$. However, such a multiplier requires a large current, and this current consumption poses a problem in the field of digital communications, which requires low power consumption, and particularly in mobile communications.

Apart from the problem of current consumption, the use of a circuit that operates on low voltage for the sake of lowering current consumption imposes a limit on the signal intensity of input signals and limits the dynamic range of the multiplier, thereby introducing distortion in the output waveform, and as a consequence, leads to inaccuracy in the 90° phase difference with the output of the T flip-flop. However, such a circuit operates over a broad band.

In the second example of the prior art, the CR and RC outputs are each:

$$A = \text{Vin}/(1 + j\omega CR)$$

$$B = (j\omega CR) \times \text{Vin}/(1 + j\omega CR)$$

The amplitude of $2f_0$ in the output component becomes small when the input of the multiplier reaches 10 mV, and as a result, the T flip-flop malfunctions. The operating frequency range when set such that ½π CR=250 MHz consequently extends from about 50 to 400 MHz, and an accurate π/2 phase shifter that operates over a broad band, and moreover, that does not exhibit a dependence on input signal amplitude is therefore difficult to achieve.

In a case employing the APC circuit as shown in the third example of the prior art, phase control is accomplished by directly varying the oscillation frequency of VCO 406 by the phase detection output 410 derived from output signal 402 of VCO 406 and reference signal 411 inputted from reference signal input terminal 401. As a result, variations occurring during fabrication, temperature fluctuations, or fluctuations in supply voltage occurring in VCO 406 or phase detector 403 of the circuit are manifested as phase error in detection voltage 410 as shown in FIG. 5, thereby preventing accurate phasing.

SUMMARY OF THE INVENTION

The present invention was achieved in view of the various problems encountered in the above-described examples of the prior art with the object of realizing a π/2 phase shifter that provides accurate operation and enables a reduction in current consumption.

A π/2 phase shifter according to a first embodiment of the present invention is constructed from a ½-frequency divider employing a T flip-flop and includes:

a current source circuit which supplies to the T flip-flop a circuit current that determines the output frequency of that T flip-flop and which varies a circuit current value in accordance with control signals; and a frequency comparator which compares the output frequency of the T flip-flop with a local signal input frequency, and which, based on the comparison result, varies the control signals in a direction such that the output frequency of the T flip-flop matches local signal input frequency.

A π/2 phase shifter according to a second embodiment of the present invention is constructed from a CR-RC circuit composed of capacitance and resistance and employing variable capacitance that varies its capacitance according to a current value, a frequency multiplier constructed using a double-balance mixer that multiplies the output frequency of the CR-RC circuit, and a T flip-flop that ½-frequency-divides the output of the frequency multiplier;

includes an amplitude comparator that compares the output amplitude difference of the CR-RC circuit and outputs a direct-current component according to the comparison results; and in which output of the amplitude comparator is fed back to the variable capacitance.

A π/2 phase shifter according to a third embodiment of the present invention is constructed from a CR-RC circuit composed of capacitance and resistance and employing variable resistance that varies its resistance according to the current value, a frequency multiplier constructed using a double-balance mixer that multiplies the output frequency of the CR-RC circuit, and a T flip-flop that ½ frequency-divides the output of the frequency multiplier;

includes an amplitude comparator that compares the output amplitude difference of the CR-RC circuit and outputs a direct-current component according to the comparison results; and in which output of the amplitude comparator is fed back to the variable resistance.

A π/2 phase shifter according to a fourth embodiment of the present invention is provided with:

a first PLL circuit that comprises an EX-OR (exclusive-OR) phase comparator that compares input signals and output signals, a first low-pass filter that smoothes the output of the EX-OR phase comparator, a first adder that inputs the output of the first low-pass filter, and a first voltage-controlled oscillator that varies oscillation frequency according to the output of the first adder;

a second PLL circuit formed from a circuit within the same semiconductor chip as the first PLL circuit and comprising a second voltage-controlled oscillator of the same type as the first voltage-controlled oscillator, a second phase comparator that compares the input signals with the output of the second voltage-controlled oscillator, and a second low-pass filter that smoothes the phase comparator output and outputs the result as a control voltage to the second voltage-controlled oscillator; and a third low-pass filter that inputs and smoothes output of the second low-pass filter and inputs the result to the adder as a reference voltage.

This embodiment may also be provided with:

a phase control input terminal, and a second adder provided between the first adder and the first voltage-controlled oscillator that adds signals inputted to the phase control input terminal and output of the first adder and outputs the result as a control voltage to the first voltage-controlled oscillator.

In the first embodiment of the present invention constructed according to the foregoing description, the current source circuit is controlled by the output of a frequency comparator that compares the output frequency of a T flip-flop. Although the output frequency of the T flip-flop is determined by the circuit current supplied from the current source circuit, the frequency comparator varies the output such that the output frequency of the T flip-flop coincides with the local signal input frequency, and as a result, the output frequency of the T flip-flop is matched with the local signal input frequency to achieve a π/2 phase shifter without using a frequency multiplier.

In the second and third embodiments of the present invention, a CR-RC circuit is constructed using a variable capacitance or variable resistance. The output frequency of this CR-RC circuit is multiplied by a frequency multiplier constructed using a double-balance mixer and then ½-frequency-divided by the T flip-flop, but a direct-current component according to comparison results of the CR-RC circuit output by the amplitude comparator is fed back to the variable capacitance or variable resistance of the CR-RC circuit, each output of the CR-RC circuit being continuously varied until the amplitude difference becomes 0, whereby the amplitude difference becomes 0, i.e., the gain of each output becomes equal and stabilizes. As a result, the gain of each output can be maintained in a constant equalized state and the operating frequency range can be broadened.

In the fourth embodiment of the present invention, the phase difference between the input signals and output signals is maintained at 90° by the first PLL circuit. This is because the EX-OR phase comparator making up the first PLL circuit becomes stable when the phase difference between input and output signals is 90°. The output of the first PLL circuit is determined by the first voltage-controlled oscillator in which oscillation frequency varies in accordance with the first adder output.

The first and second PLL circuits are formed from circuits within the same semiconductor chip, and therefore, variations arising in fabrication for each circuit block are identical. Here, sources of phase error in the first PLL circuit are caused by, for example, variations in self-driven oscillation frequency of the first voltage-controlled oscillator. If such variations originate in, for example, fabrication discrepancies, offset (voltage phase error) of the control voltage (detection voltage) of the second PLL circuit and offset of the control voltage (detection voltage) of the first PLL circuit will exhibit the same trends.

Control voltage signals of the second PLL circuit, which is constructed from a second voltage-controlled oscillator having the same form as the first voltage-controlled oscillator, are made the absolute value of the offset voltage by passage through the third low-pass filter and are inputted to the first adder. As a result, the first PLL circuit is caused to oscillate by a control voltage from which the offset portion has been removed, and stable oscillation can be achieved regardless of discrepancies arising from fabrication, temperature fluctuations, or source voltage fluctuations.

In a case in which a phase control input terminal and second adder are provided, the output of the first voltage-controlled oscillator varies in accordance with input signals to the phase control input terminal, and phase difference between input signals and output signals can therefore be regulated between 0° and 90°.

The above and other objects, features, and advantages of the present invention will become apparent from the following description based on the accompanying drawings which illustrate examples of preferred embodiments of the present invention.

BRIEF DESCRIPTION OF THE DRAWINGS

FIG. 2 is a waveform chart illustrating the operation of a prior-art example.

DETAILED DESCRIPTION OF THE PREFERRED EMBODIMENTS

Figure 1:
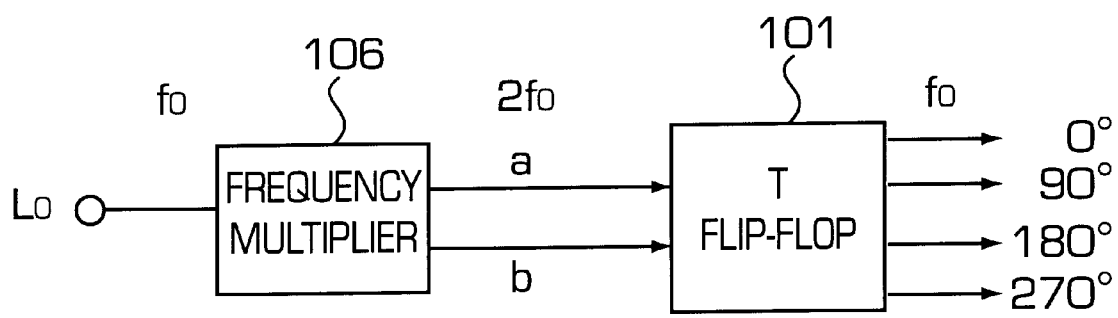
FIG. 1 is a block diagram showing the construction of an example of the prior art.
Figure 3A:
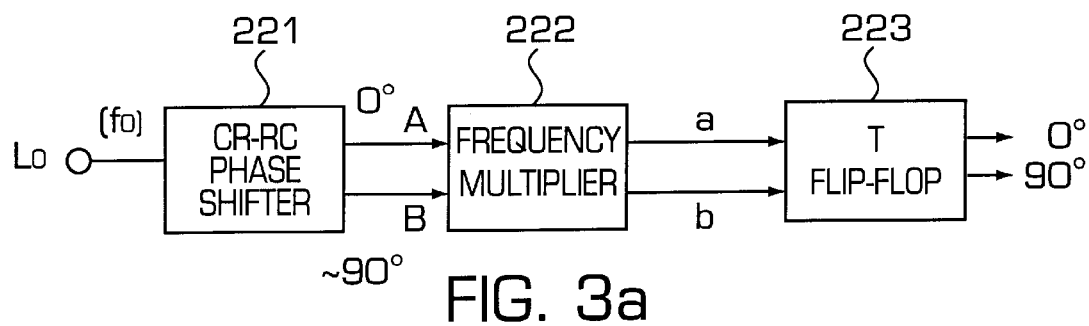
FIG. 3(a) is a block diagram showing the construction of an example of the prior art.
Figure 3B:
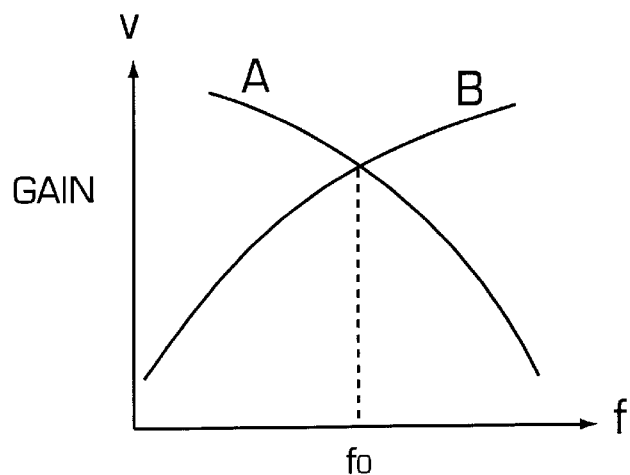
FIG. 3(b) and FIG. 3(c) are waveform charts illustrating the operation of the prior-art example.
Figure 3C:
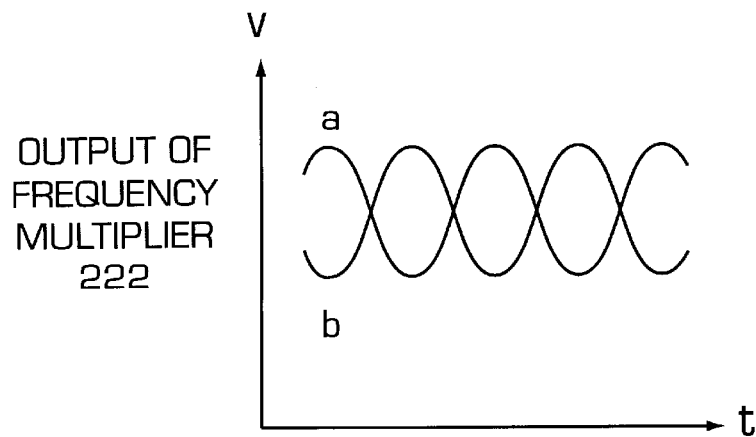
Figure 4:
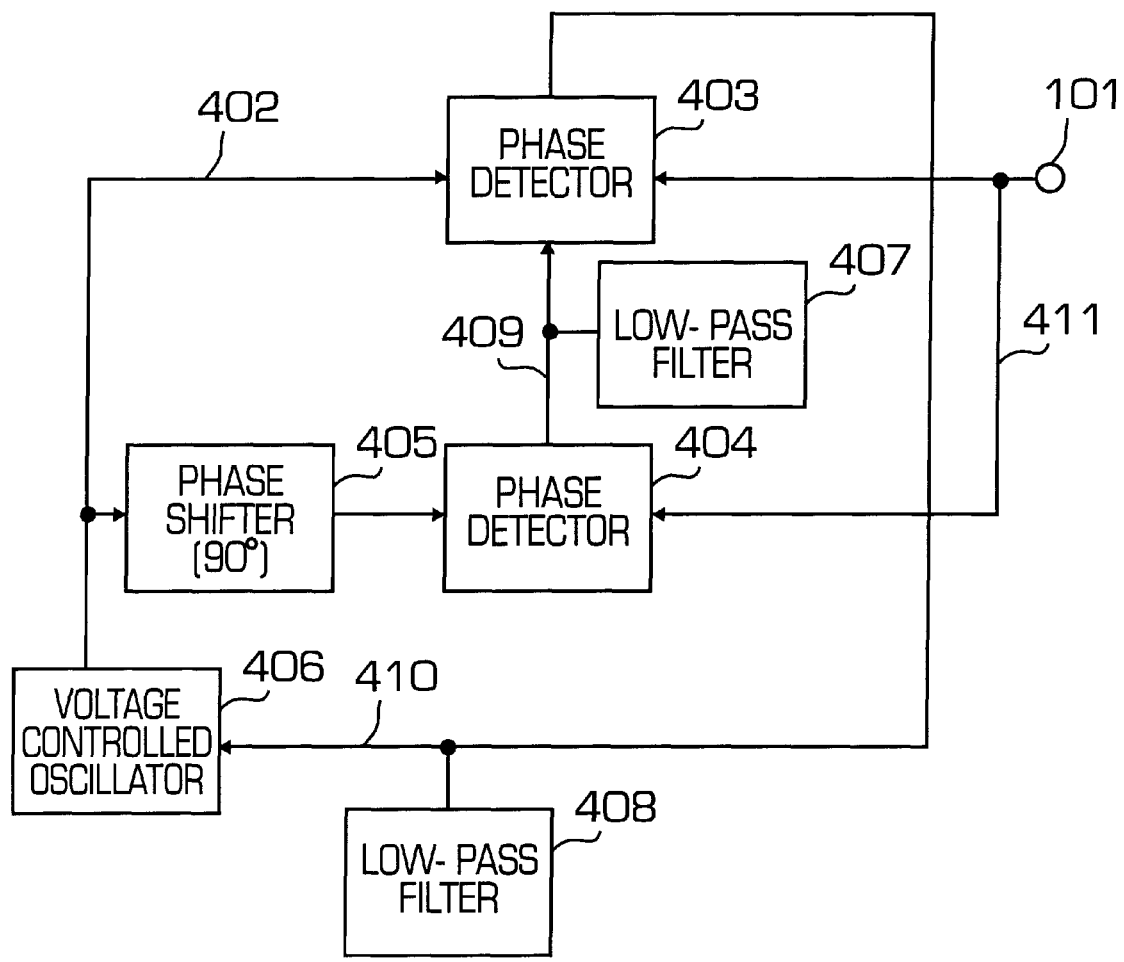
FIG. 4 is a block diagram showing the construction of an example of the prior art.
Figure 5:
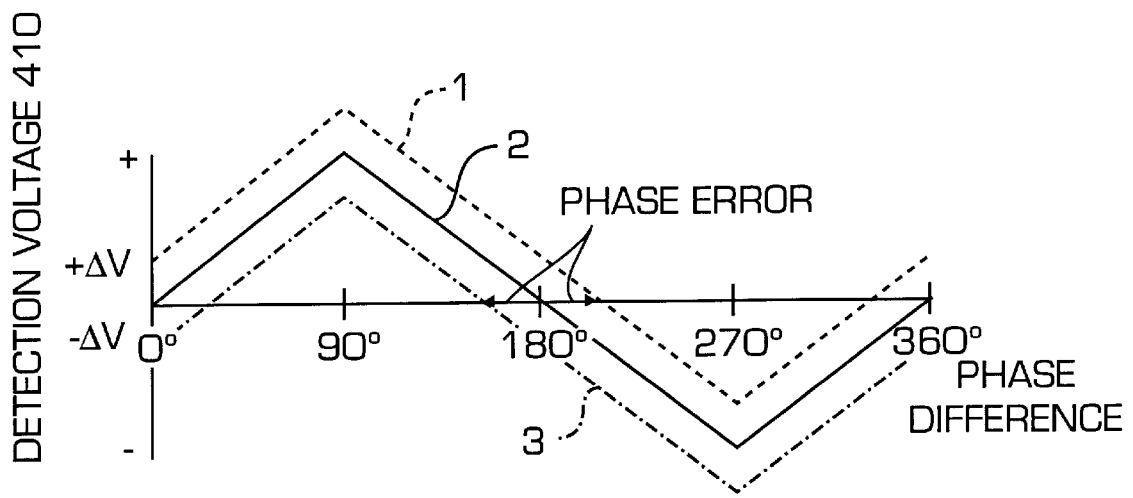
FIG. 5 is a waveform chart illustrating the operation of the prior-art example.
Figure 6:
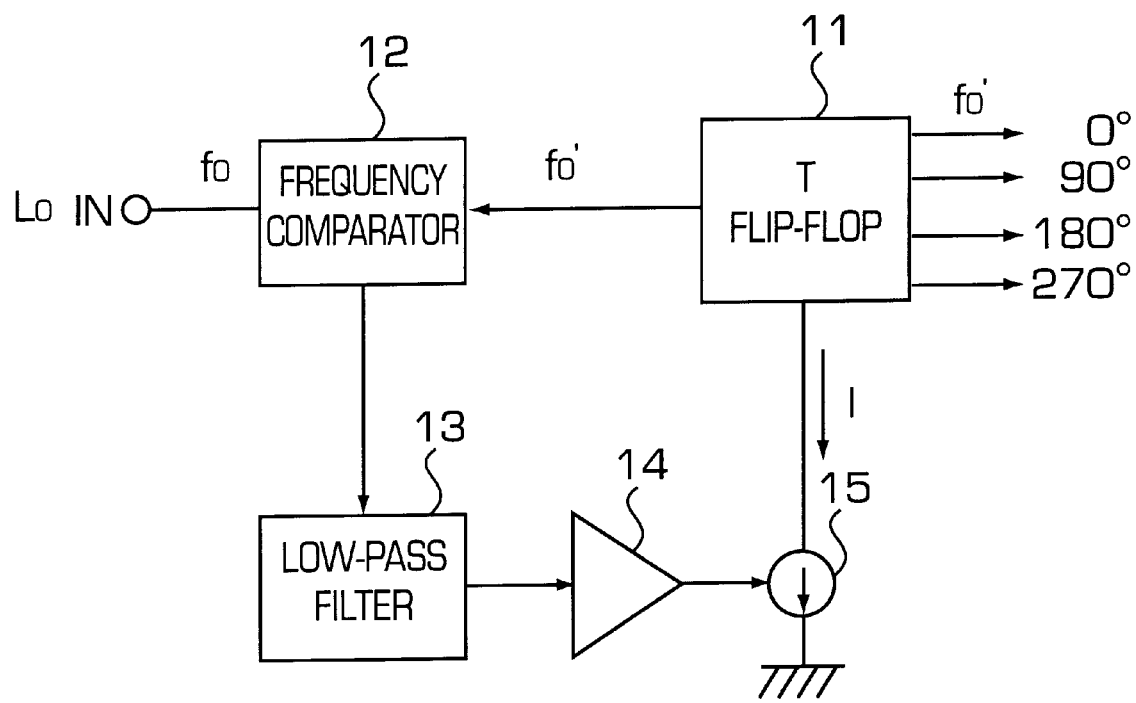
FIG. 6 is block diagram showing the construction of the first embodiment of the present invention.

The present invention will next be described with reference to the accompanying figures. FIG. 6 is a block diagram showing the construction of the first embodiment of the present invention, and FIG. 7 is a circuit diagram of the embodiment shown in FIG. 6.

The present embodiment is constructed from T flip-flop 11, frequency comparator 12 that inputs and compares the output of T flip-flop 11 and carrier frequency signal $L_0$, low-pass filter 13 that inputs the output of frequency comparator 12, direct-current amplifier 14 that amplifies the output of low-pass filter 13, and current-source circuit 15 that determines the circuit current of T flip-flop 11 in accordance with the output voltage of direct-current amplifier 14.

Figure 7:
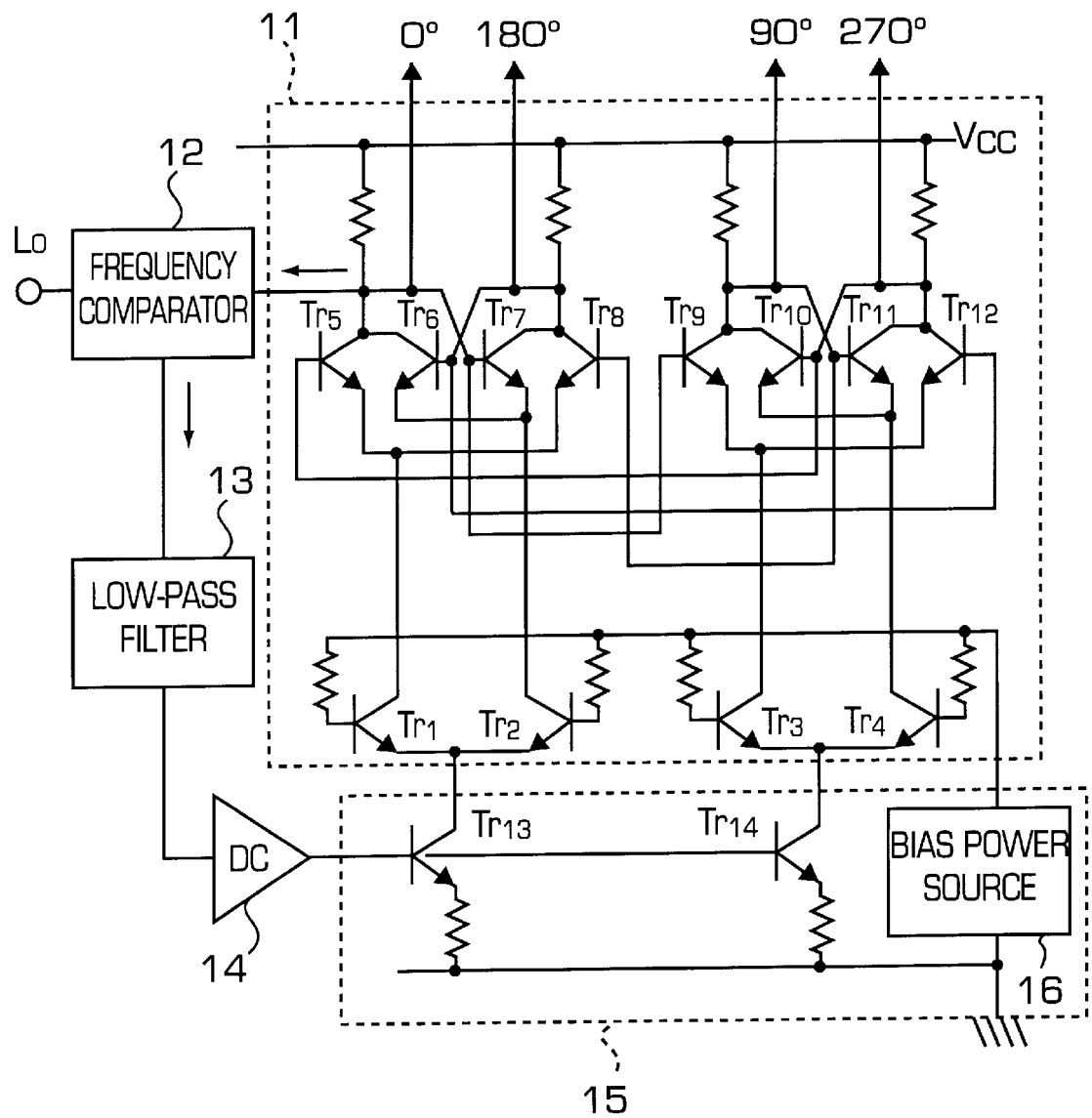
FIG. 7 is a circuit diagram of the embodiment shown in FIG. 6.

T flip-flop 11 and current-source circuit 15 are constructed as shown in FIG. 7. Only direct-current bias of equal potential is impressed to input differential transistors $Tr_1$–$Tr_4$, and a DC bias current that accords with the output of T flip-flop 11 is fed back to the bases of current-source transistors $Tr_{13}$ and $Tr_{14}$ by a feedback circuit composed of frequency comparator 12, low-pass filter 13, and direct-current amplifier 14.

Figure 8:
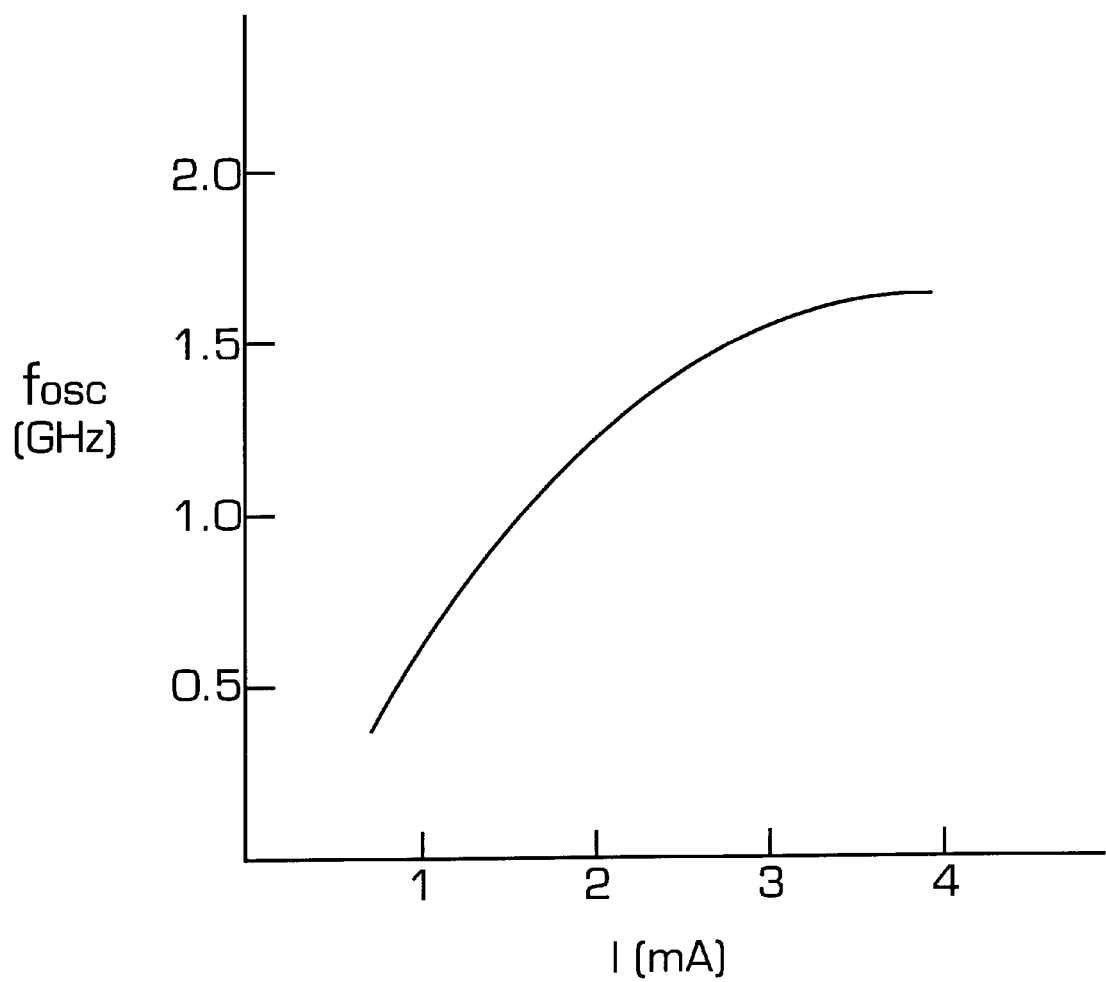
FIG. 8 is graph showing the characteristics of oscillation frequency and current of the embodiment shown in FIG. 6.

FIG. 8 shows the correlation between the self-driven oscillation frequency of a T flip-flop and circuit current I. In the above-described state, transistors $Tr_5$–$Tr_{12}$ having collectors joined with the bases of other transistors perform self-driven oscillation, but the collector output of each transistor in a self-driven oscillation state maintains an accurate phase difference of 0°, 90° 180°, and 270°.

The output signal of T flip-flop 11 is inputted to frequency comparator 12, compared with the frequency $f_{LO}$ of carrier frequency signal $L_0$, and the difference is converted to a DC offset voltage. The output of frequency comparator 12 is passed through low-pass filter 13 where only the DC component is selected, the result is amplified by direct-current amplifier 14 and then fed back to current-source transistors $T_{13}$ and $T_{14}$ of the T flip-flop. In this way, the circuit current supplied from bias power source 16 is determined and the self-driven oscillation frequency of T flip-flop 11 is matched to frequency $f_{LO}$ of the carrier frequency signal $L_0$.

By forming the above-described feedback loop, a $\pi/2$ phase shifter that accurately $\pi/2$-shifts carrier frequency signal $L_0$ can be obtained. With such a construction, the frequency multiplier required in the prior art can be omitted and current consumption can be reduced. This type of feedback circuit is employed in ordinary PLL circuits and can easily be manufactured within an IC.

Furthermore, field-effect transistors (FET) may be used as the transistors constituting the above-described circuit, and in such a case, the same effects can be obtained.

Figure 9:
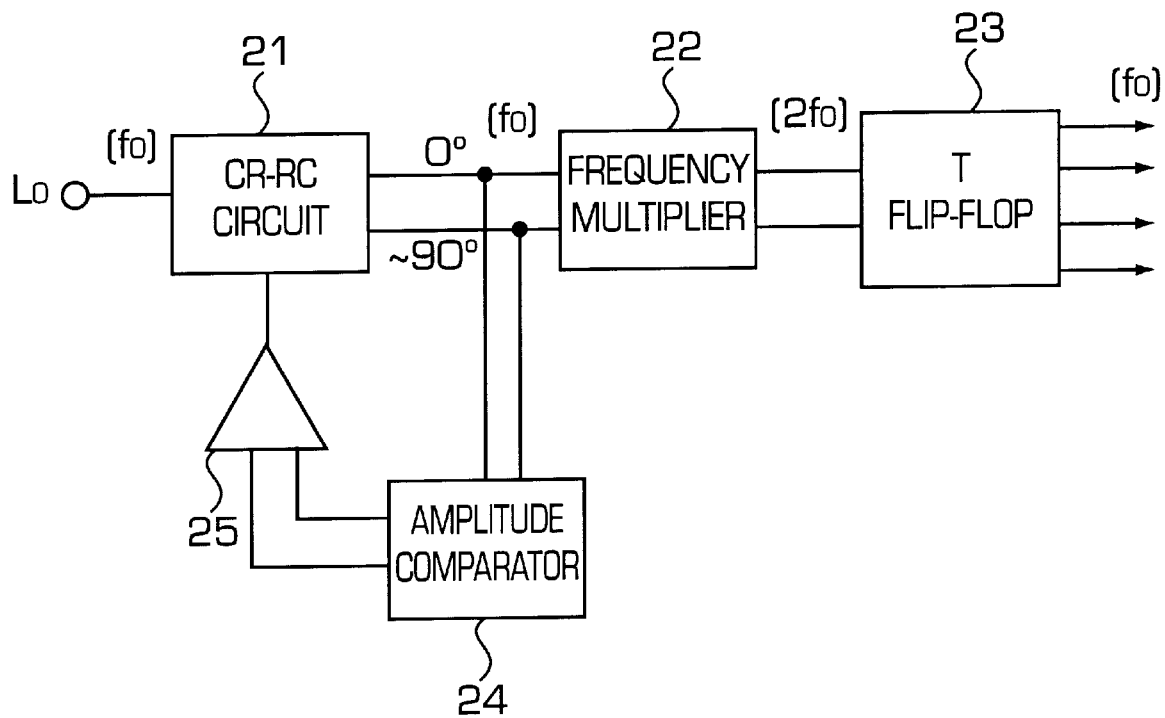
FIG. 9 is a block diagram showing the second embodiment of the present invention.

The second embodiment of the present invention will next be described. FIG. 9 is a block diagram showing the construction of this embodiment. The output of CR-RC circuit 21, which inputs carrier frequency signal $L_0$, is connected to amplitude comparator 24 in addition to frequency multiplier 22. The output of amplitude comparator 24 is fed back to CR-RC circuit 21 by way of direct-current amplifier 25. The multiplied output of frequency multiplier 22 is outputted to T flip-flop 23 and a $\pi/2$ phase difference signal is outputted.

Figure 10:
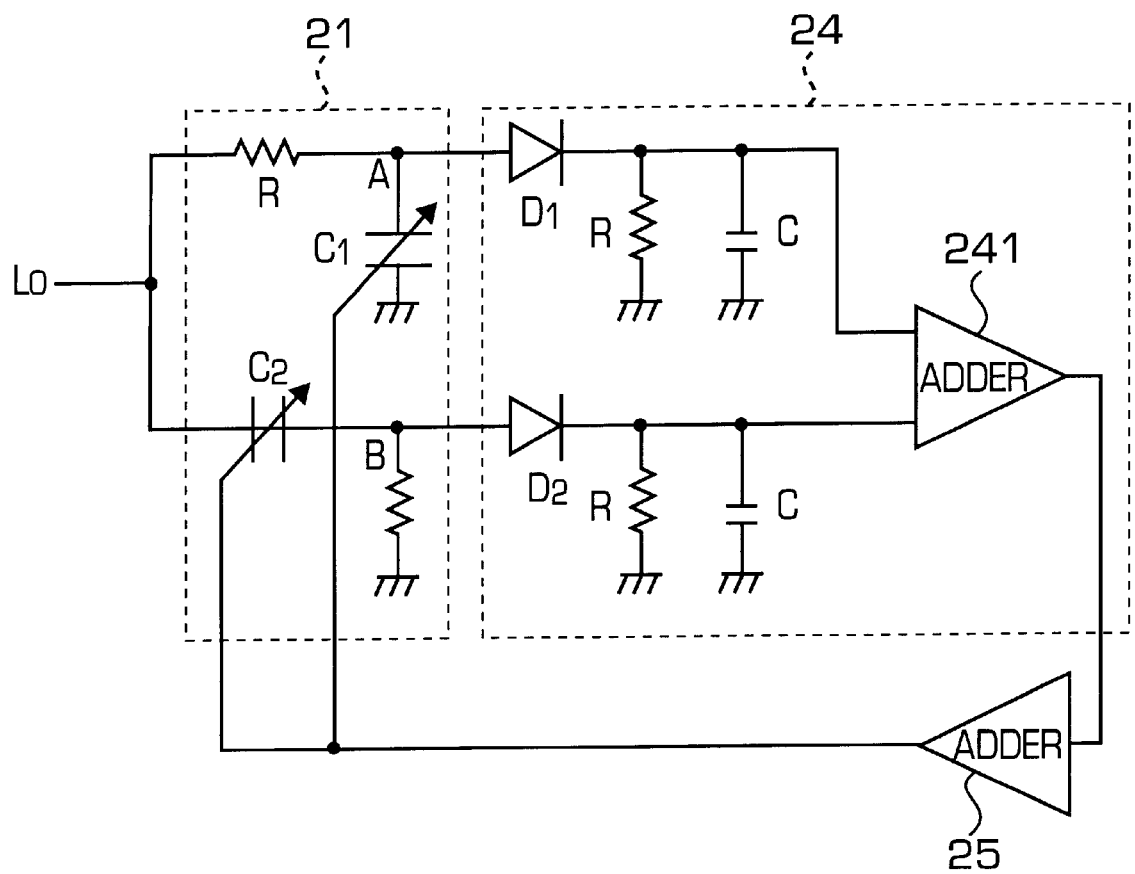
FIG. 10 shows an example of the circuit configuration of the embodiment shown in FIG. 9.

In the present embodiment, the amplitude difference of the output of CR-RC circuit 21 is extracted as the direct-current component by passage through amplitude comparator 24. FIG. 10 shows one example of this type of amplitude comparator 24 and variable CR-RC circuit 21.

In the example shown in FIG. 10, amplitude comparator 24 is constructed from a diode detection circuit using diodes $D_1$ and $D_2$ and adder 241, the output of CR-RC circuit 21 is outputted as the DC differential by passage through amplitude comparator 24, and is fed back to variable capacitance $C_1$ and $C_2$ which constitute CR-RC circuit 21 by way of direct-current amplifier 25.

Here, if $f_1$ is assumed to be the frequency at which the output amplitudes at point A and point B are equal, then:

$$f_1 = 1/2\pi C_1 R_1$$

When the local input frequency is changed to $f_2$, the amplitude at $R_1 C_1$ output point A and the amplitude at $C_1 R_1$ output point B are respectively:

$$A = V_{in}/(1+j\omega_2 C_1 R_1)$$

$$B = (j\omega_2 C_1 R_1) \times V_{in}/(1+j\omega_2 C_1 R_1)$$

The amplitude difference is:

$$|A|-|B|=(1-\omega_2 R_1 C_1)/(1+\omega_2^2 R_1^2 C_1^2)^{1/2} \qquad (1)$$

This amplitude difference is made (DC by passage through amplitude comparator 24 and direct-current amplifier 25 and fed back to variable capacitances $C_1$ and $C_2$ which make up CR-RC circuit 21. This type of voltage variable capacitance can be easily realized by using, for example, varactor diodes.

In such a case, $$C_2 = C_0(1 + \Delta DC/\phi)^{-1}$$

where $C_0$ is the junction capacitance when $\Delta DC$ is 0, and $\phi$ is the contact potential difference at the point of junction.

Figure 11:
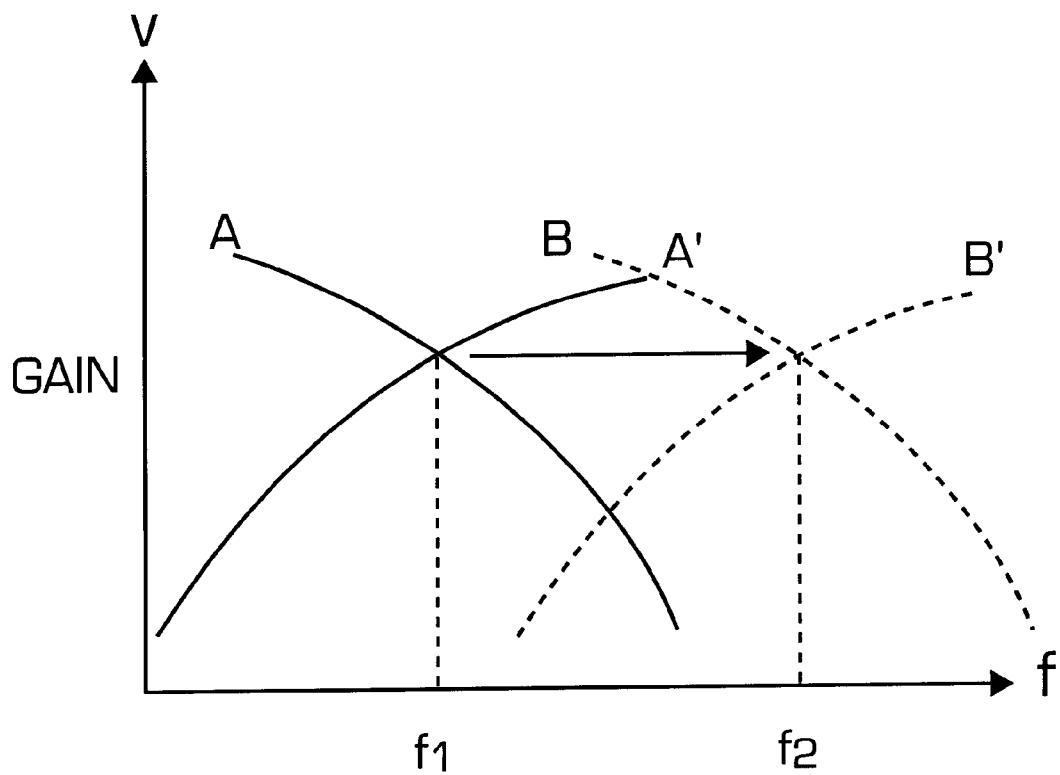
FIG. 11 shows the CR-RC output characteristics in the second embodiment of the present invention.

In formula (1), locking occurs at the point at which $|A|-|B|-0$. In other words, $\omega_2 C_1 R_1 - 1$. The characteristics curves at points A and B are shown in FIG. 11. As a result, the output amplitudes at points A and B are always the same amplitude.

If the capacitance values and resistance values of the CR-RC circuit are equal, the phase difference at points A and B will always be 90°. Due to discrepancies between elements, however, phase differences will not ordinarily be exactly 90°. In the present embodiment, this output is inputted to frequency multiplier 22, and signal $2f_0$ is obtained. By inputting to frequency multiplier 22 signals having a substantially 90° phase difference, an output waveform free of distortion is inputted to T flip-flop 23 and signals $f_0$ (0°) and $f_0$ (90°) having an accurate 90° phase difference can be obtained.

As a result, the operation range of the phase shifter of the present embodiment is determined by the operation range of the T flip-flop, and an accurate $\pi/2$ phase shifter can be achieved on a broad band of, for example, $f_0=50$ MHz-2 GHz. Moreover, such a $\pi/2$ phase shifter is not influenced by the amplitude of local input.

In addition, in the above-described embodiment, the CR-RC circuit uses variable capacitance that changes capacitance according to the current value such that the phase difference of each output of the CR-RC circuit is 90°, but the same effect can be obtained by using variable resistance that changes resistance value according to the current value.

Figure 12:
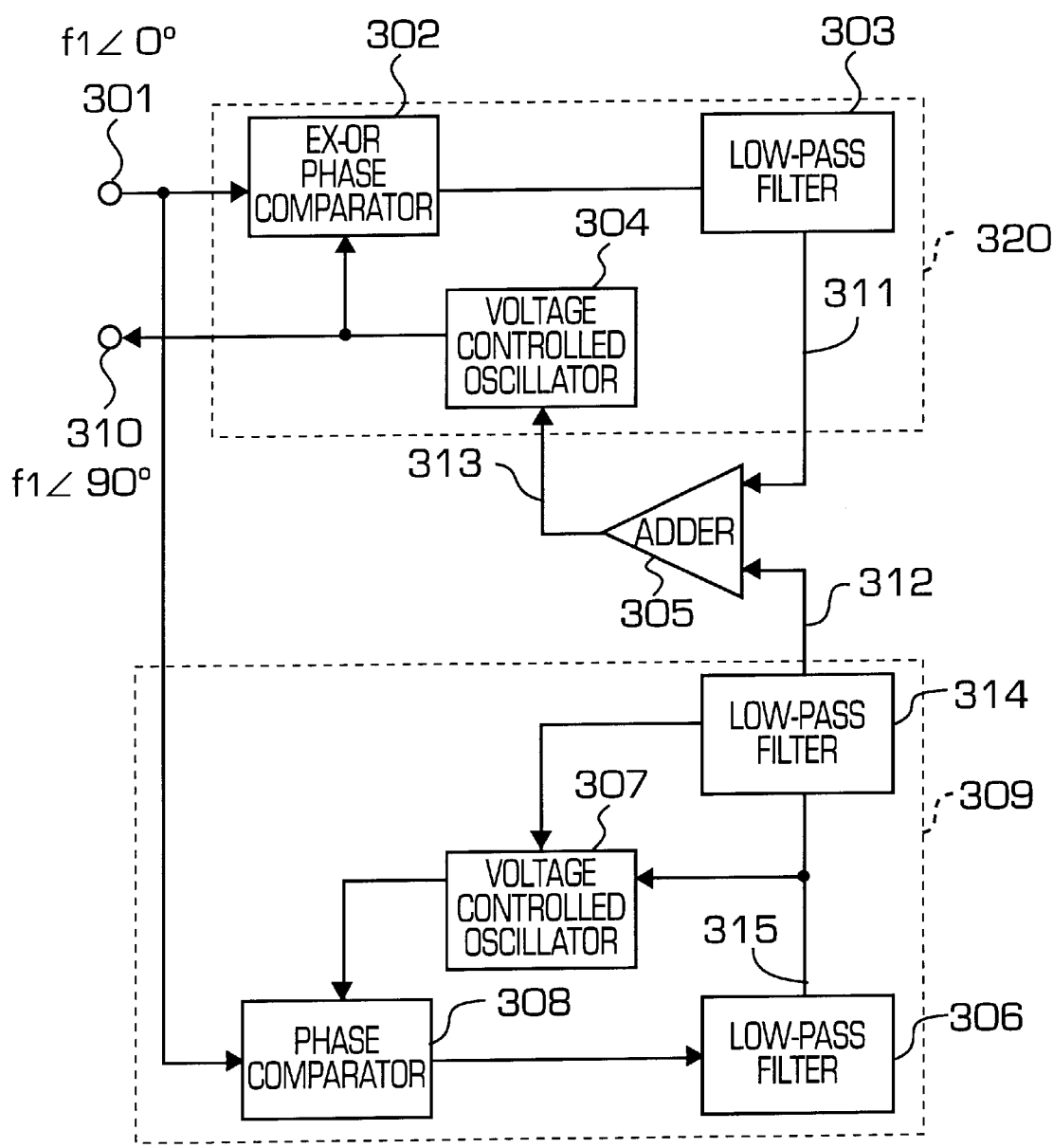
FIG. 12 is a block diagram showing the third embodiment of the present invention.
Figure 13A:
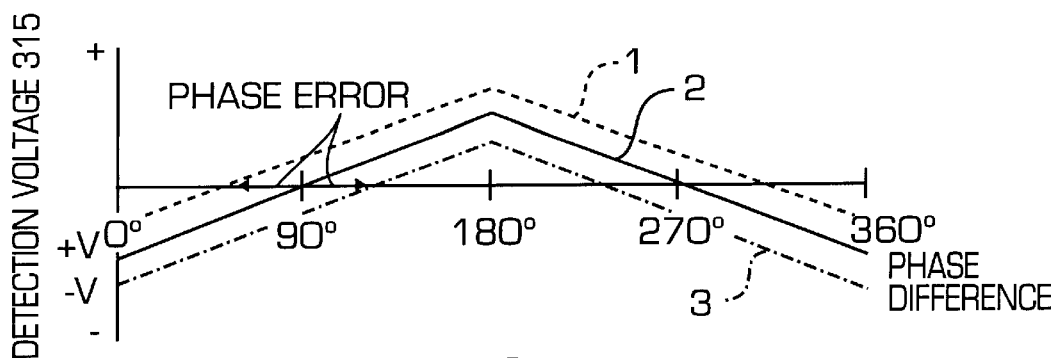
FIG. 13(a) to FIG. 13(d) show each of the output characteristics for the phase detector shown in FIG. 12.
Figure 13B:
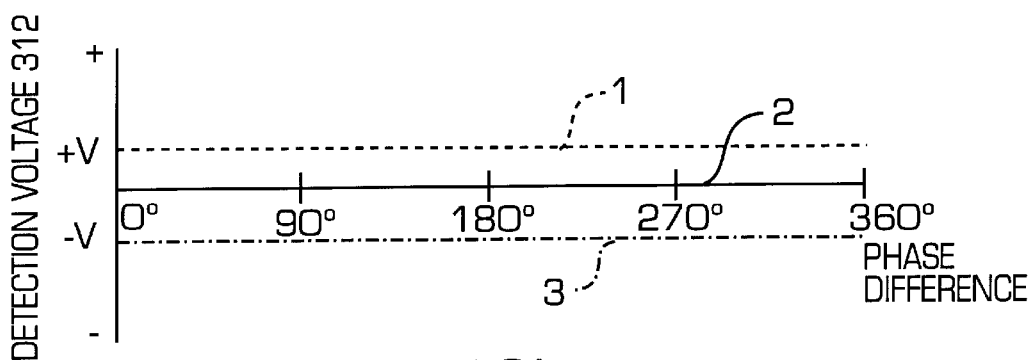
Figure 13C:
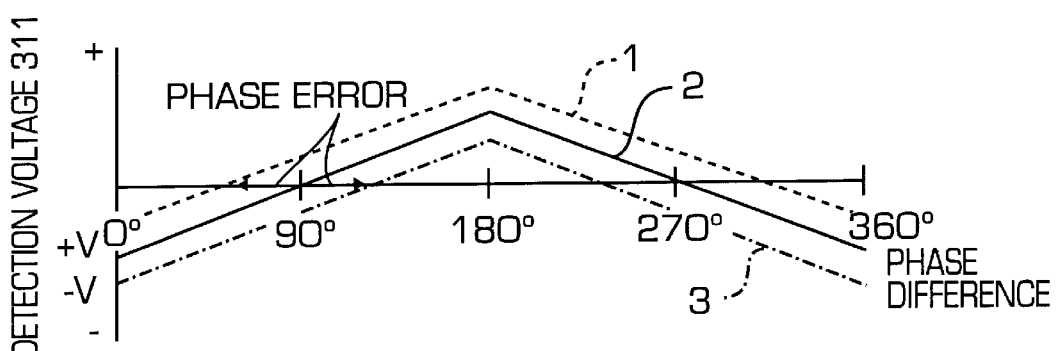
Figure 13D:
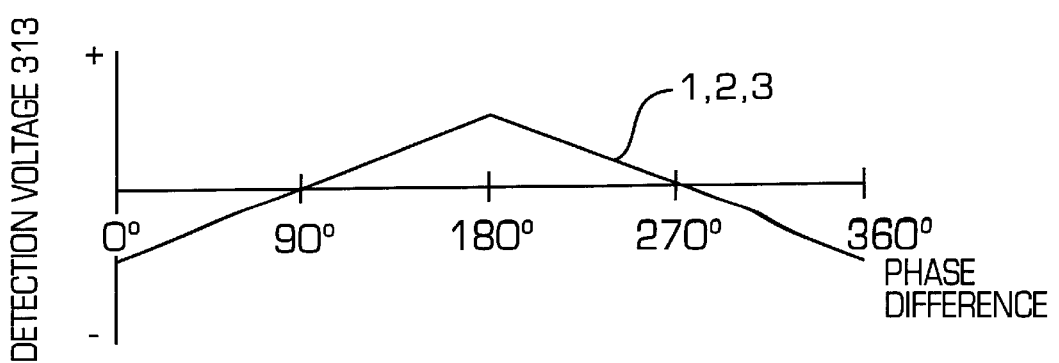

The third embodiment of the present invention will next be explained with reference to FIG. 12. FIG. 12 is a block diagram showing the construction of this embodiment.

In the present embodiment, a first PLL circuit is composed of EX-OR phase comparator 302, low-pass filter 303, adder 305, and voltage-controlled oscillator 304. By means of this PLL circuit, the phase of output signals from output terminal 310 can be made 90° with respect to that of input signals to input terminal 301. This is because EX-OR phase comparator 302 stabilizes and outputs 0 when phase difference between input and output signals is 90°, and outputs voltage according to phase difference when the phase difference is not 90°.

In the present embodiment, moreover, a second PLL circuit 309 is composed of voltage-controlled oscillator 307, phase comparator 308, and low-pass filter 306, 314. Detection voltage 315 of the second PLL circuit 309 is both outputted to voltage-controlled oscillator 307 and smoothed by low-pass filter 314 to the extent that detection voltage 312 can be seen as substantially direct current with respect to detection voltage 311 (10–100 times the time constant). The phase error occurring at first PLL circuit 320 can be compensated by inputting detection voltage 312 to adder 305 as a reference voltage.

FIGS. 13(a)–(d) show detection voltages for each portion shown in FIG. 12. The principles of phase error and compensation using the detection voltages of the present embodiment will next be explained with reference to FIG. 13.

In each figure, a broken line (1) indicates detection voltage for a case in which a +V offset voltage occurs, a solid line (2) indicates detection voltage for a case in which offset voltage does not occur, a dot-dash line (3) indicates an operation waveform in a case in which a −V offset voltage occurs.

If the circuits of the embodiment shown in FIG. 12 are formed on the same semiconductor chip, variations occurring in fabrication will be identical for each of the circuit blocks. Here, phase error in the first PLL circuit 320 in FIG. 13(c) originates from variations in the self-driven oscillation frequency of voltage-controlled oscillator 304 and variations in offset in phase comparator 302. If these variations are caused by discrepancies in manufacturing, the offset (voltage phase error) of detection voltage 311 of the first PLL circuit will exhibit the same trends as the offset of detection voltage 315 of second PLL circuit 309. The absolute value of offset voltage is monitored by detection voltage 312, and a stabilized detection voltage 313 can be obtained by subtracting detection voltage 312 from detection voltage 311 by means of adder 305. Temperature fluctuations and source voltage fluctuations are dealt with in the same way.

Figure 14:
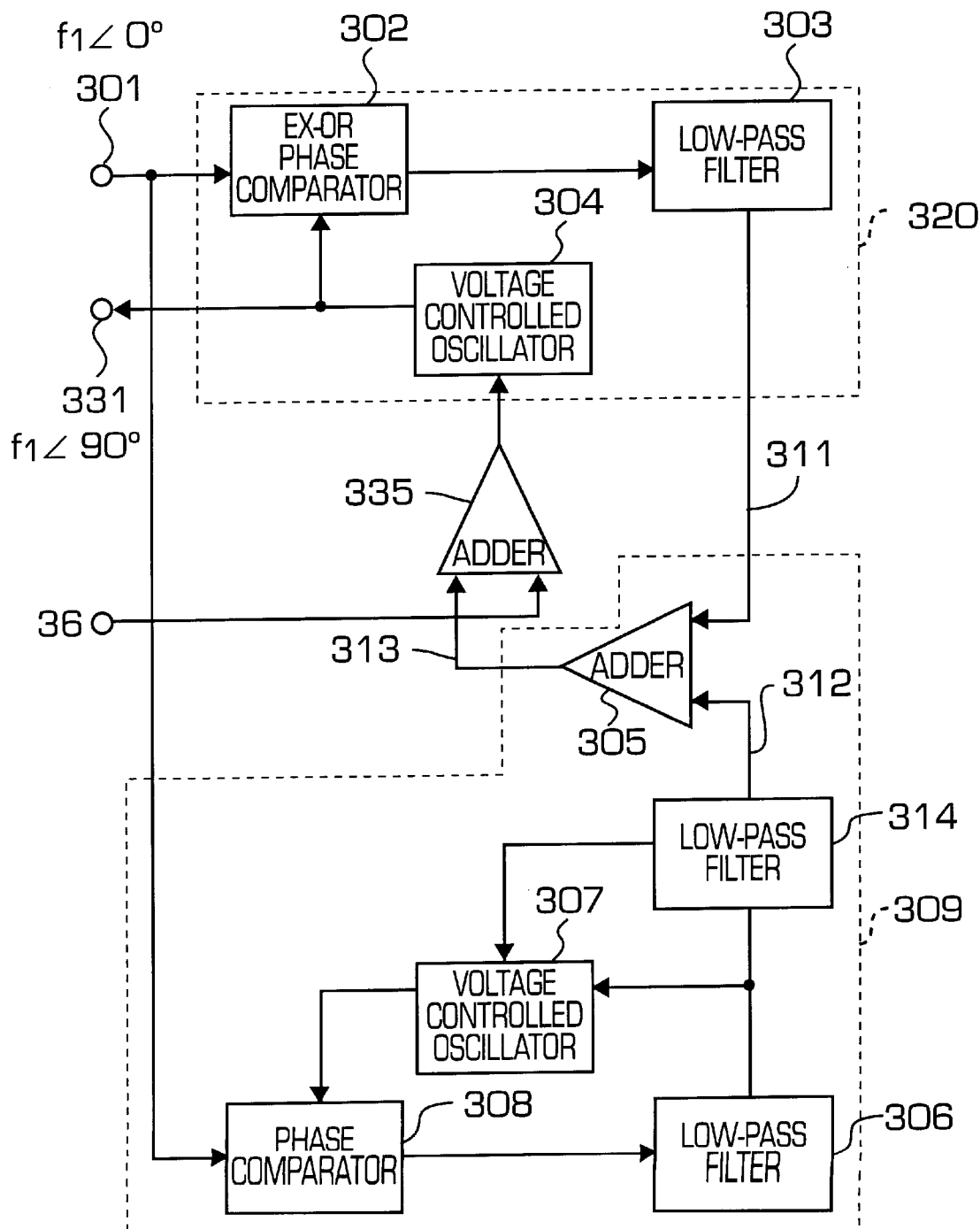
FIG. 14 is a block diagram showing the construction of the fourth embodiment of the present invention.

FIG. 14 is a block diagram showing the circuit configuration of the fourth embodiment of the present invention. In this embodiment, adder 335 and phase control signal terminal 336 have been added to the circuit of the third embodiment shown in FIG. 12. The input terminals of adder 335 are connected to the output terminal of adder 305 and phase control signal terminal 336, thus allowing the phase difference between input signals to input terminal 301 and output signals from output terminal 310 to be varied over a range of 0–90° in accordance with signals inputted to phase control signal terminal 336.

The above-described phase control also enables stabilized operation regardless of variations occurring in fabrication, temperature fluctuations, and source voltage fluctuations.

The above-described constructions of the present invention exhibit the following effects:

By constructing a feedback loop from a phase shifter that uses a T flip-flop and a frequency comparator that compares the output frequency of the T flip-flop with local signal input frequency, the output frequency of the T flip-flop can be matched to the local signal by passing the output of the frequency comparator through a low-pass filter and a direct-current amplifier and feeding back a direct-current component to the current source of the T flip-flop. In this way, a $\pi/2$ phase difference can be obtained without employing a frequency multiplier, and as a result, a signal of accurate $\pi/2$ phase difference can be obtained with low power consumption even in a high-frequency band.

Moreover, in a $\pi/2$ phase shifter constructed from a CR-RC circuit composed of variable capacitance, variable resistance, or a combination of the two; a frequency multiplier that multiplies the output of the CR-RC circuit; and a T flip-flop that ½-frequency divides the output of the multiplier; an amplitude comparator can be used to compare the output amplitude of the CR-RC circuit and output a direct-current component; and feedback of this direct-current component to the variable capacitance or variable resistance by way of a direct-current amplifier enables fixed CR-RC output over a broad band as well as multiplier output that is free of distortion over a broad band. Due to the accurate operation of the T flip-flop, a $\pi/2$ phase shifter can be realized that is accurate over a broad band.

In addition, by means of a construction that employs two PLL circuits, a reference voltage that indicates phase error of the first PLL circuit can be generated by the second PLL circuit, thereby enabling automatic compensation that reduces phase errors due to variations arising in fabrication, temperature fluctuations, or source voltage fluctuations.

Finally, phase difference between output signals and input signals can be regulated between 0 and 90°, thereby allowing an improvement in ease of use.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A $\pi/2$ phase shifter for $\pi/2$ phase shifting a local input signal, comprising:

a toggle flip-flop for generating a phase-shifted output signal;

a current source circuit for providing to said toggle flip-flop a current that determines an output frequency of said output signal, and receiving a control signal which varies said current; and a frequency comparator for comparing said output frequency with a frequency of said local input signal, and generating said control signal based on the comparison to vary said current so that the output frequency of said output signal is equal to said frequency of said local input signal.

2. The $\pi/2$ phase shifter according to claim 1, further comprising:

a low pass filter for filtering said control signal generated by said frequency comparator; and an amplifier for amplifying the control signal filtered by said low pass filter and providing the amplified control signal to said current source circuit.

3. The $\pi/2$ phase shifter according to claim 1, wherein said current source circuit comprises:

a current source connected to said toggle flip flop; and a plurality of transistors connected to said current source for receiving said control signal to vary said current.

* * * * *